（12） United States Patent
O'Riordan et al.

(10) Patent No.: US 7,085,700 B2
(45) Date of Patent: Aug. 1, 2006

(54) METHOD FOR DEBUGGING OF ANALOG AND MIXED-SIGNAL BEHAVIORAL MODELS DURING SIMULATION

(75) Inventors: Donald J. O'Riordan, Santa Clara, CA (US); Richard Trihy, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 821 days.

(21) Appl. No.: 09/886,166

(22) Filed: Jun. 20, 2001

(65) Prior Publication Data

US 2003/0018459 A1    Jan. 23, 2003

(51) Int. Cl.
  *G06F 17/50*   (2006.01)
(52) U.S. Cl. ............................. 703/14; 703/17; 703/18; 717/125
(58) Field of Classification Search .................. 703/14, 703/27, 17, 18; 714/38; 717/125
  See application file for complete search history.

(56) References Cited

U.S. PATENT DOCUMENTS

| | | | |
|---|---|---|---|
| 4,590,581 A | 5/1986 | Widdoes, Jr. ................ 364/578 |
| 4,635,218 A | 1/1987 | Widdoes, Jr. ................ 364/578 |
| 4,985,860 A * | 1/1991 | Vlach ........................... 703/17 |
| 5,546,562 A | 8/1996 | Patel ........................... 395/500 |
| 5,588,142 A * | 12/1996 | Sharrit ......................... 703/14 |
| 5,930,153 A * | 7/1999 | Melville et al. ............... 703/14 |
| 5,995,733 A * | 11/1999 | Roychowdhury ............... 716/6 |
| 6,110,217 A * | 8/2000 | Kazmierski et al. ........... 703/14 |
| 6,154,716 A * | 11/2000 | Lee ................................ 703/2 |
| 6,266,630 B1 * | 7/2001 | Garcia-Sabiro et al. ....... 703/14 |
| 6,275,956 B1 * | 8/2001 | On et al. ..................... 717/125 |
| 6,308,300 B1 * | 10/2001 | Bushnell et al. ............... 716/4 |
| 6,374,297 B1 * | 4/2002 | Wolf et al. .................. 709/226 |
| 6,530,065 B1 * | 3/2003 | McDonald et al. ............. 716/4 |

* cited by examiner

*Primary Examiner*—Thai Phan
(74) *Attorney, Agent, or Firm*—Michael A. Glenn; Glenn Patent Group

(57) ABSTRACT

An improved method for debugging of analog and mixed signal behavioral models during simulation using Newton-Raphson iteration replay. The method according to the invention has substantially modified the prior art solution by limiting the interactive debugging steps in a replay of the last iteration of the accepted timepoints. Using this method, the user only interacts with the simulation during the iteration replay, and only for the accepted solution points. If the user is single stepping through this simulation, the simulator enters interactive mode at each statement during the replay. Similarly, if not single stepping, but a breakpoint has been triggered, the simulator enters the interactive mode at the appropriate statement to honor the breakpoint. While the iteration replay is performed, the system of equations does not need to be solved again. Instead, the solution vector is reinstated from the known solution of the last iteration.

26 Claims, 2 Drawing Sheets

METHOD FOR DEBUGGING OF ANALOG AND MIXED-SIGNAL BEHAVIORAL MODELS DURING SIMULATION

FIELD OF THE INVENTION

The invention relates generally to simulation and testing technology. More particularly, the invention relates to an improved method for debugging of analog and mixed signal behavioral models during simulation. We denote this method as Newton-Raphson iteration replay.

BACKGROUND OF THE INVENTION

Analog circuit simulations, whether purely analog or the analog content of a mixed-signal design, can be performed as part of a DC analysis in which a circuit operating point is determined. Simulations may also be performed as part of a transient analysis in which circuit behavior is determined as a function of time. The analog solution process formulates a system of non-linear differential equations representing the design at the DC operating point or at each timepoint during a transient analysis. It then solves the equations using some iterative technique. The solution to this system of equations gives the DC operating point of the circuit during the DC analysis, or if combined with some numerical integration methods, provides the instantaneous behavior of the circuit at each timepoint during the transient analysis.

During DC analysis or at each solution timepoint, there are two major phases to the solution process: (1) formulating a system of equations by executing the model code for each model instance in the design, and (2) solving this system of equations. Since the equations may be non-linear, a direct solution cannot be performed, and hence these phases are performed within an iterative loop until the sequence of solutions converges upon an acceptable solution. A common iterative technique is Newton-Raphson Iteration. The basic idea of this technique is encapsulated using the following pseudo-code:

```
foreach ( DC solution or transient analysis trial timepoint) {
    foreach Newton-Raphson Iteration, i {
        linearize the system of non-linear equations
            about previous solution i-1
        formulate system of linear equations Ax = b
        solve system of linear equations Ax = b for solution vector,
    x
    }
}
```

The solution vector x contains the values of the circuit "unknowns" which may represent the circuit node voltages or other unknowns of interest such as certain currents. The matrix A, commonly known as Jacobian matrix, can be constructed using techniques such as Modified Nodal Analysis (MNA), Nodal Analysis (NA), or other techniques. The vector b, commonly known as Residual vector, is also constructed using such techniques. During any particular Newton-Raphson iteration i, when the system of linearized equations is formulated, the simulator has actually linearized about the previous solution value x (i−1). Thus, for any given iteration, the values present in the Jacobian matrix A and Residual vector b are a function of the solution vector x of the previous iteration. The iterative process continues, building the system Ax=b, and solving for a new value of x, after which a new system Ax=b is built and solved for until successive solutions converge upon acceptable values for the unknowns in x.

The process is complicated by the fact that at a particular trial timepoint, the iterations may fail to converge, or may converge too slowly. During a transient analysis, the analog simulator may reject the trial timepoint that failed to converge and attempt to obtain the circuit solution at a different timepoint. This is repeated until convergence is achieved and before moving forward with time and continuing the process. There may be also other reasons for rejecting a trial timepoint and choosing an earlier timepoint, which further complicate the process.

The selection of trial timepoints is algorithmically determined, as is the decision of when to reject a particular timepoint. As such, a sequence of trial timepoints may arise as follows:

0.0 0.1 0.3 0.5(rejected) 0.4 0.45 0.52 0.62 0.8 1.2 (rejected) 0.95

The timepoint sequence is generally increasing. But it is not monotonically increasing because solutions at times 0.5 and 1.2 are rejected. After the first rejection, the timepoint is reduced to 0.4, and after the second rejection, it is reduced to 0.95. After each rejection, simulation continues with a new (reduced) timepoint.

The repeated nature of building and solving such systems of equations for each iteration of each timepoint explains why analog simulation is considered slow or expensive compared to digital simulation, which operates at an entirely different level of abstraction and uses a completely different algorithm. Analog simulation involves solving systems of equations, which translates into matrix inversion operations, and these are computationally expensive.

An analog hardware description language (AHDL), or mixed signal description language such as Verilog-AMS, or the VHDL-AMS, provides a user a capability of modeling his design at a much higher level of abstraction than that of using primitive objects such as transistors, resistors, etc. It can thus be used in, and in fact it is a prime enabler of, top down design methodologies for analog and mixed-signal designs. Such languages allow a user to describe the analog functionality of his design in a manner somewhat similar to how a digital designer today uses one of the HDL's such as Verilog or VHDL to describe his digital circuit behavior. The analog functionality is described in a high level language, which consists of one or several blocks of concurrent behavior, within which there are a number of statements of sequential behavior. Examples of such languages which enable this level of modeling analog behavior include SpectreHDL, Verilog-A, Verilog-AMS and VHDL-AMS. One example using Verilog-A syntax or Verilog-AMS syntax is given below:

```
// this is a comment. Declare a module
module dac__8bit__ideal (vd7, vd6, vd5, vd4, vd3, vd2, vd1, vd0, vout);
//declare its terminal list
electrical vd7, vd6, vd5, vd4, vd3, vd2, vd1, vd0, vout;
//declare its parameters
parameter real vref = 1 from [0:inf);
parameter real trise = 0 from [0:inf);
parameter real tfall = 0 from [0:inf);
parameter real tdel = 0 from [0:inf);
parameter real vtrans = 2.5;
    real out__scaled; //declare a variable representing output (scaled)
    // define the analog behavior using sequential statements
    analog begin
```

-continued

```
        out_scaled = 0;
        out_scaled = out_scaled + ((V(vd7) > vtrans) ? 128:0);
        out_scaled = out_scaled + ((V(vd6) > vtrans) ? 64:0);
        out_scaled = out_scaled + ((V(vd5) > vtrans) ? 32:0);
        out_scaled = out_scaled + ((V(vd4) > vtrans) ? 16:0);
        out_scaled = out_scaled + ((V(vd3) > vtrans) ? 8:0);
        out_scaled = out_scaled + ((V(vd2) > vtrans) ? 4:0);
        out_scaled = out_scaled + ((V(vd1) > vtrans) ? 2:0);
        out_scaled = out_scaled + ((V(vd0) > vtrans) ? 1:0);
        // contribute to the output of this module.
        // Affects Jacobian matrix A, Residual b.
        V(vout) <+ transition( vref*out_scaled/256, tdel, trise,
trfall ) ;
    end
endmodule
```

Within the analog begin/end pair of the above model, the individual statements, which are delimited by semi-colons, are executed in sequence. Such a model could also include if-then-else statements, C-like switch statements, etc.

The last line of the analog block:

$V$(out)<+transition(vref*out_scaled/256, tdel, trise, tfall);

is used to specify that the value of the expression, vref*out_scaled/256, is to be driven onto the output pin of the module, where the previous lines were used to calculate the value of the variable out_scaled.

Consider again the analog simulation process:

```
foreach ( DC solution or transient analysis trial timepoint) {
    foreach Newton-Raphson Iteration, i {
        linearize the system of non-linear equations
            about previous solution i-1
        formulate system of linear equations Ax = b
        solve system of linear equations Ax = b for solution vector, x
        }
    }
```

During the formulation of the system of linear equations Ax=b, the analog simulator evaluates the model code for each device or model instance in the design. In the process, each device contributes entries to the Jacobian matrix A, and the Residual vector b. As mentioned previously, these contributions are functions of the previous value of the unknown vector x. In addition to built-in primitives such as resistors, and MOS transistor models such as Bsim3v3, each analog behavioral model is also responsible for loading its contributions in the matrix x and vector b. Using the example above, the contribution into matrix A involves the value of the expression, "vref*out_scaled/256", which is loaded in such a way as to affect the value of the unknown variable "out." Here "out" is represented somewhere in the solution vector of unknown x. The final value of "out_scaled" used in the expression is derived by executing the previous sequential statements. Each sequential statement of analog behavioral code for each model is thus "evaluated," in order to create matrix A and vector b. The users find interest in evaluation of the behavioral statements because the result of executing these user-written statements affects matrix A and vector b and hence affects the behavior of the circuit/design as a whole. Since the evaluation of the statements within the analog block is sequential, it makes sense to attempt to provide a debugging capability to allow the user to interactively single-step through the evaluation of such statements, inspect the values of the variable and other objects contained within and modified by the statements, create breakpoints on individual statements, breakpoints on individual variables changing value, follow the evaluation of if-then-else blocks, and generally allow the user to determine if the statements in his model function correctly or incorrectly.

When an AHDL or a mixed-signal behavioral modeling capability is added to an analog circuit simulator such as Spectre/SPICE, or a mixed-signal circuit simulator such as AFFIRMA AMS, the analog behavioral code is executed by the simulator's analog solver at every Newton-Raphson iteration of every trial timestep during a transient analysis, just as the model code (equations) for built-in primitive semiconductor device models are executed. During the Newton-Raphson iteration process, the simulator calculates new entries for the RHS vector and the Jacobian matrix, which are functions of the current solution vector. For behavioral code such as an analog block in Verilog-AMS or SpectreHDL, this involves evaluation of the behavioral code.

As part of a transient analysis, the simulator calculates a new trial timepoint and performs the Newton-Raphson iteration at that timepoint. It then decides whether to accept the solution at that timepoint and continue (advance time) or reject the solution at that timepoint and back up time, redoing the iterations at a "sooner" timepoint.

The prior art solution to the problems of interactive debugging is to stop the simulation before every evaluation of every analog behavioral statement, and present an interactive prompt to the user. The user could then interactively traverse his design, inspect signal values, or step and execute the next behavioral statement (again stopping before the next one), and create breakpoints, etc.

The implementation of the prior art involves instrumenting the code generated for the analog behavioral statements, inserting a special opcode at the beginning of each statement. The engine which evaluates the analog behavioral statements is then modified to pause and present the user with an interactive prompt at each of these special opcodes, not continuing until the user issues a "run", "continue" or "step" command.

This solution, or some variation thereof, is common for debugging sequential operations, and is implemented in some form in many conventional programming language debugging tools as well as in digital simulators in the EDA marketplace. The basic idea in such kind of solution is to provide the capability of stopping to go interactive before every single statement is executed.

The disadvantages of the prior art solution are numerous. For examples:

1. Non-Monotonicity of Time. The transient simulation algorithm described above is complicated by the fact that a trial timepoint solution may be rejected for various reasons. Such reasons include synchronization with the digital engine in a mixed signal simulation, violation of the Local Truncation Error (LTE) requirements in the integration method used as part of the transient analysis to handle the differential part of the non-linear differential equations, and device limitation, etc. Because of the rejection of some timepoints, the simulation time is not moving monotonically forward. Users such as circuit designer and modeling engineer are not generally familiar with the underlying intricacies of analog simulation and transient analysis algorithms. They may consider time to be monotonically increasing. If they observe the value of time moving forwards and backwards during debugging, they may feel confused. Additionally, in order to verify that the time-dependent behavior of their models is correct, the users need to see the value of simulation time during debugging. Therefore, simply hiding the time from users is not a viable solution.

2. Rejected Timepoints. As previously described, solutions calculated at any given timepoint may be rejected for various reasons. If a user is single-stepping through his models looking for a bug, he has to go through a lengthy single-stepping process in order to debug his model and/or design—he has to single step through every statement of every iteration of every rejected timestep. Since the solutions at these timesteps are then completely discarded by the simulator, the user may have wasted a substantial amount of time while single stepping through these solutions.

3. Newton-Raphson Iteration Process. Since an analog simulator cannot directly solve a system of non-linear equations, it performs an iterative process in which the user's model statements are executed for every single iteration. This is another artifact of simulation that probably does not interest the user. For example, if the user intended to write the following statement:

if (a>b) begin
do something
end but instead accidentally used the less-than operator as in if (a<b) begin
do something
end then one single iteration is probably sufficient for him to find this bug. The user is often not interested in single stepping through all the Newton-Raphson iterations. In many cases, he probably desires to remain blissfully ignorant that there is any iterative process being performed at all. Language users tend to think of sequential operations and usually are unaware of the analog simulator's requirements on iterative processes to solve non-linear equations. Again, it is confusing to the user in an iterative situation and time consuming and wasteful to stop before every evaluation of every statement.

While allowing to debug each iteration may be useful for an advanced user who tries to debug convergence problems in his modules, it would be more useful to abstract these iterations away for the more typical user who simply tries to debug logic and control issues such as the less than operator example illustrated above. When the variables a and b in the example depend on some node voltages, the if statement, from one iteration to the next, may evaluate first to true and then to false because the values of a and b depend on the current "guess" at the solution. This may further confuse the user and waste even more time as he single steps through each iteration and observes what appears to be radically different behavior from one iteration to the next.

4. Object Value-Change Breakpoints. A value-change breakpoint is a concept of interrupting the simulator and presenting the interactive prompt to the user whenever a particular variable of interest to the user is written to or changes value. Since a variable may be written to on each of many Newton-Raphson iterations, it is demanding upon the user to interrupt the simulation for each of these. A generic "watch" on all write attempts to a variable as would be implemented using standard sequential program debugging approaches would thus result in a lot of wasted stopping points. Again, some of these may be on timepoints that are subsequently rejected, which is completely wasteful.

In addition, if non-monotonicity of time exists, a user who pays close attention to changes in a particular variable but not-very-close attention to the actual simulation time may observe what he considers to be very strange behavior. For example, a variable that stores the simulation time or some function of the simulation time would be expected to increase monotonically. However, because the timepoint sequence is not increasing monotonically, the variable cannot increase monotonically either. This, again, leads to a potential source of user confusion and lack of confidence in the product. Another drawback would be for the user who is watching value changes on a variable that is supposed to represent a voltage on some circuit node, or some function of the voltage. If he expects the voltage to increase linearly, then he would expect the values of the variable to increase linearly also when each breakpoint is reached. However, due to the nature of Newton-Raphson iteration, a succession of guesses at a node voltage may oscillate quite a bit before finally converging on the actual solution. While the actual solutions may be increasing monotonically, the individual solutions as part of the Newton-Raphson process are not likely to be, thus again confusing the user who is monitoring a variable that depends linearly on the node voltage.

5. Nodal-Value Change Breakpoints. A user may be interested in interrupting the simulation whenever a particular node changes value, or changes value "significantly". For example, when a user tries to debug simulation "glitches", if he observes the value of the node solution during every Newton-Raphson iteration, he might observe some wildly varying per-iteration values on the node before it finally converges upon the actual solution. The converged solution may be still unchanged from the previously accepted solution, and thus not of interest from a "glitch-debugging" perspective. This effect can be even further exaggerated by the timestep rejection process.

6. Performance Degradation. By having the simulator check if it needs to present an interactive prompt before every single evaluation of every statement, for every iteration and for every trial timepoint (accepted or not), simulation time is wasted. Hence this method is computationally inefficient and can degrade simulation performance by performing many possibly redundant checks. Additionally, for object value change/access breakpoints, much time may be spent in checking every access of a particular variable, contributing to further inefficiency.

7. Exposure of Timestep Selection Algorithm. An analog transient simulation algorithm involves choosing trial timepoints and attempting solutions, while possibly rejecting some timepoints in favor of other timepoints. The user needs to know the current value of time while interactively debugging his model in order to determine if it is exhibiting the correct time-dependent behavior. Much of what distinguishes one analog simulator from another boils down to the specific algorithms used by the analyses, including the heavily used transient analysis. By allowing the user to single step through every iteration of every timepoint, rejected or otherwise, in a simulation, and showing him the current value of time (i.e. informing the user of the current timepoint), the sequence of timepoints chosen by the algorithm is exposed. This opens up the possibility of reverse engineering the timestep selection algorithm if the user is a competitor.

8. Exposure of Timepoint Rejection Algorithm. A drawback of exposing every single timepoint, whether accepted or not, is that the algorithm which decides when a particular timepoint is rejected is also exposed. It is easy to determine which are the accepted timepoints, and thus the rejected timepoints become apparent. Choosing which timepoints to reject is also an important and distinguishing characteristic of a particular simulator. It enables certain optimizations, such as, the simulator decides to reject the timepoint before convergence is even reached, if convergence is "not likely to happen" or is "happening too slowly", in favor of another timepoint that is likely to converge more quickly. Again, exposing the rejected timepoints using the previous debugging solutions opens up the possibilities of reverse engineering this algorithm.

9. Exposure Of Other Timepoint-Related Algorithms. A simulator may decide to reject a solution for reasons other than non-convergence. These reasons may also include synchronization reasons in a mixed-signal simulator. The prior art solution could thus expose to competitors the algorithms (synchronization and other) involved in mixed-signal simulation tools which contain the analog solution engine as part of a larger product. In other words, it is not simply the analog simulator that is at stake, but the mixed-signal simulator also.

What is desired is to provide a capability of interactively debugging behavioral models during simulation without need to single step through every statement of every iteration of every timestep, including rejected timesteps.

SUMMARY OF THE INVENTION

The invention provides a capability of interactively debugging the behavioral code in analog or mixed-signal behavioral models, and a capability of debugging the interaction of such models in the design, by allowing circuit unknowns, such as node voltages, throughout the design to be interactively inspected as the simulation progresses. The method according to the invention has substantially modified the prior art solution by limiting the debugging interaction steps in a replay of the last iteration of the accepted timepoints. Using this method, the user only interacts with the simulation during the iteration replay, and only for the accepted solution points. If the user is single stepping through the simulation, the simulator enters interactive mode at each statement during the replay. Similarly, if not single stepping, but a breakpoint has been triggered, the simulator enters the interactive mode at the appropriate statement to honor the breakpoint only during the iteration replay. While the iteration replay is performed, the system of equations does not need to be solved again. Instead, the solution vector is reinstated from the known solution of the last iteration.

DETAILED DESCRIPTION OF THE INVENTION

Figure 1:
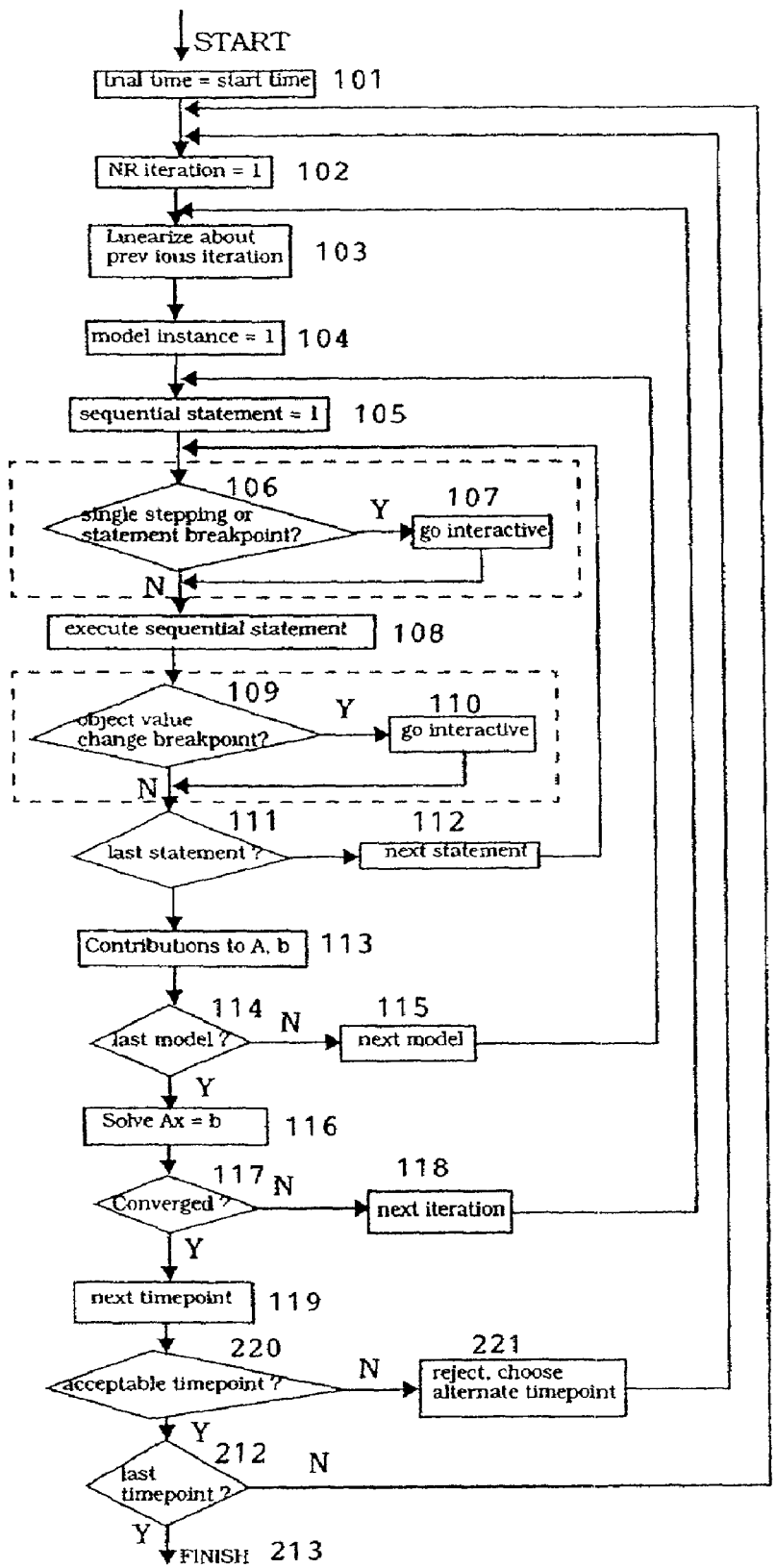
FIG. 1 is a flowchart for a standard analog module debugging approach which represents the prior art solution.

Referring to FIG. 1, which is a flowchart for a standard analog module debugging approach which represents the prior art solution, the dashed line boxes including the steps 106–107 and 109–110 indicate the areas to which this invention has made modifications.

Figure 2:
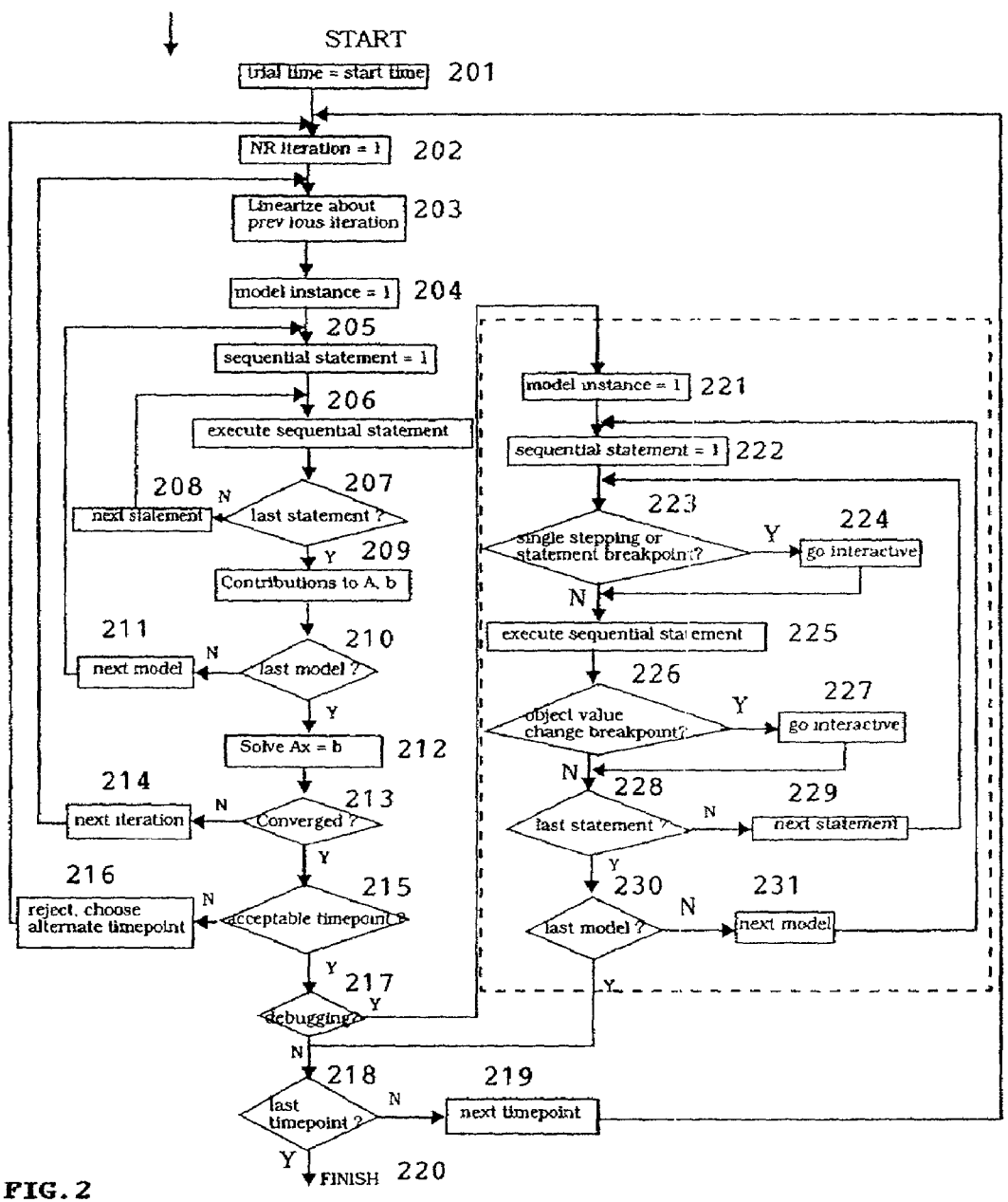
FIG. 2 is a flowchart illustrating the modifications to the transient analysis algorithm for enhanced debugging of analog behavioral code in analog and mixed-signal behavioral models according to the invention.

FIG. 2 is a flowchart illustrating the modifications to the transient analysis algorithm for enhanced debugging of analog behavioral code in analog and mixed-signal behavioral models according to the invention. The dashed box to the right of FIG. 2 including steps 221–231 replaces the two dashed boxes in FIG. 1. This replacement constitutes the enhancements to the standard transient analysis algorithm.

From Step 201 to Step 217, the standard transient analysis algorithm is followed regularly. The simulator sets a trial time 201; initializes Newton-Raphson iteration 202; linearizes about the previous iteration 203; and chooses model instance 204. Once the behavioral statements for each model have finished evaluation 204–208, the Jacobian matrix A and the Residual vector b are loaded for each model 209, and the system of equations Ax=b is solved 212. If the solution x has not converged, then another iteration is performed 214. The sequence of iterations and solutions continues until convergence 213. Once convergence is achieved, the simulator makes a decision on whether or not to accept this solution at this timepoint 215. If the decision is not to accept the timepoint, then the timepoint is rejected 216. A new timepoint is calculated, and the iterative process begins again at 202. This continues until a timepoint and its corresponding converged solution are accepted 217. The standard transient analysis algorithm has been generally followed thus far, with the exception of noting if statement breakpoints have been encountered or value changes or write access breakpoints have occurred on "interesting" objects.

Before advancing time and moving onto the next trial timepoint, the simulator makes a decision on whether the activity that occurred during the currently accepted timepoint is of any interest to the user based on the stepping mode or the breakpoints that the user has created 217. If no, then time is advanced to the next trial timepoint, and the simulation continues 219–202. If yes, the process is completed 220.

If the user is debugging by single stepping through the simulation, or has had a breakpoint triggered, then the recent iteration activity is deemed to be of interest to the user and thus steps 221–231 are followed. In steps 221–231, an identical repeat of the last Newton-Raphson iteration of the just accepted timepoint is performed, but this time the simulator becomes interactive as appropriate allowing the user to interact with the simulation.

If the user is single stepping, the simulator enters interactive mode at each statement during the replay. Similarly, if not single stepping, but a breakpoint has been triggered, for example, when a value-change or write access breakpoint is triggered, the simulator enters the interactive mode at the appropriate statement to honor the breakpoint.

Steps 221–231 is not an extra iteration with the Newton-Raphson iteration process, but rather it has to be an exact replay of the previous iteration, using exactly the same data and producing exactly the same results for the system of equations. This allows the user to interactively observe what is going on in the specific section of the simulation that he is actually debugging.

To perform an extra iteration interactively, rather than an identical repeat or replay of the last iteration, would present the user with different data from that accepted by the simulator. That would lead to further confusion. Performing an exact iteration replay does require saving and restoring certain state information, storing the solution vector and reconstruction of the matrix A and vector b based on the solution vector on the first-before-last iteration.

The replay of the last Newton-Raphson iteration of the accepted timepoint, with user interaction now included, allows the user to see the activities of interest to him (i.e. reaching certain statements, following the flow of execution within the sequential statements, observing when breakpoints are triggered) without forcing these upon the user for each iteration of each timepoint, accepted or otherwise. This can be observed from FIG. 2, where the interaction tasks are contained within a much lesser degree of nested loops, than what is evident in FIG. 1.

Due to the modification in simulation and debugging flow, the user only interacts with the simulation during the iteration replay 221–231, and only for the accepted solution points. The activity that is observable by the user during this interactive iteration replay is sufficient for the user to debug many kinds of problems which may be evident in his modules and/or design, without suffering the hardships and disadvantages faced by prior methods and simulation tools.

After the iteration replay has been performed, the system of equations does not need to be solved. Instead, the solution vector is reinstated from the known solution prior to the iteration replay. This represents a further optimization and gain in efficiency. As a consequence, an even further optimization is performed during the iteration replay itself, in that the entries in the Jacobian matrix A and Residual vector b do not need to be filled in since this system will never be solved for the second time.

Most analog simulators eventually solve a linear system of equations $Ax=b$, where x represents the circuit unknowns, such as node voltages. Some other analog simulators solve a linear system of equations $Ax=b$, where x does not represent the circuit unknowns, but instead represents the difference in the circuit unknowns between the previous iteration and the current iteration. Correspondingly, the Residual vector b contains some different information, and an initial guess at the circuit unknowns is required. The iteration replay debugging method according to this invention applies equally to both cases, provided that an exact iteration replay is performed as shown in the dashed box portion of FIG. 2.

In a linear system where no iterative solution is required and a direct solve is possible, the user interacts with the simulation only during the solutions at accepted timepoints, and is thus insulated from the timestep selection/rejection process. The converse is also true, in that the method can also be applied to a simulator in which no algorithm (other than something trivial) is used for the timestep selection/rejection, but in which an iterative process is used for solving a system of non-linear differential equations. In both cases, some complex part of the underlying implementation is not displayed to the user. This allows him to concentrate exclusively on debugging his model, without distraction or confusion from the artifacts of simulation.

The method presented in FIG. 2 abstracts away from the user both the concepts of timestep selection and rejection, and the Newton-Raphson iteration required for solution of nonlinear systems of equations. The user only gets to interact with the simulation during a single iteration replay of accepted timepoints and does not get to interact with the simulator during the regular timestep solution/rejection process, or the regular iterative non-linear equation solution process.

The method or process described above may be carried out by a computer usable medium containing instructions in computer readable form. In other words, the method or process may be incorporated in a computer program, a logic device, e.g. a PLD, ASIC, or FPGA, a firmware, and/or may be downloaded from a network, e.g. a Web site over the Internet.

The advantages of this invention over the prior art solution are numerous. For examples:

1. By abstracting away the timestep selection mechanism and allowing a user to interact with the simulation during accepted timesteps only, time is perceived as always monotonically increasing. The user is thus not confused by a timepoint sequence that apparently moves forwards and backwards.

2. By abstracting away the rejected timepoints, the user thus only has to deal with the timepoints which are of actual relevance lo the final simulation results (the accepted timepoints). This saves time and effort from the user's perspective while stepping through his models and observing time-dependent behavior, and/or general purpose single stepping.

3. By abstracting away the Newton-Raphson iterations, the user can concentrate on debugging the logic and control flow, such as the if-then-else statements, of the sequential statements within his module, without being distracted by or wasting time upon many Newton-Raphson iterations.

4. By abstracting away the Newton-Raphson iterations, the user does not have to deal with the different flows of control in his module from one iteration to the next, caused by the if statements which contain expressions that change as a result of one iterative solution guess to the next.

5. Most users are unaware of the iterative process that underlies analog simulation. By abstracting away the Newton-Raphson iterations, the user can continue to debug and simulate his model in general without being forced to spend time learning to understand and deal with the iterative process. This results in greater efficiencies of time for the user.

6. By abstracting away the Newton-Raphson iterations, the user needs only to check for value changes on objects at every write access once per accepted timestep, instead of every write access, at every iteration, at every trial timestep, accepted or otherwise. Again, this translates into less work and hardship for the user.

7. By abstracting away the timestep acceptance and rejection mechanism, the user is not confused by values which are supposed to change as a simple function of simulation time. The example of a variable that is a linear function of simulation time applies, and the user now observes the variable increase monotonically in value (as expected) as the simulation progresses and as the value change breakpoints are triggered.

8. By abstracting away the Newton-Raphson iteration process, value bearing objects (e.g. variables) whose values depend on the current guess at the circuit solution no longer appear to oscillate or vary randomly, from one Newton-Raphson iteration to the next, until convergence is achieved. The exact dependency of a variable or object upon a circuit unknown may not always be immediately obvious to the user from inspecting the behavioral source text. Again, this serves to remove a substantial source of confusion for the user.

9. By abstracting away the Newton-Raphson iteration process, a user attempting to debug the sources of "glitches" in his design is not distracted or confused by the apparently random variations in circuit unknowns (such as node voltages, or probed currents) that result from different simulator guesses at the circuit solution vector, until convergence is achieved. This translates into a further example of user-friendless.

10. By abstracting away the timepoint selection and rejection mechanism from the user, the user's attempt to debug the sources of glitches in his design are again enhanced. Apparent but unreal glitches due to poor convergence that would be observed while debugging timepoints that are then subsequently rejected (due to poor convergence behavior or failure) are removed from the user's perspective, which allows the user to concentrate exclusively on the real glitches in his design/model.

11. By removing the need for the simulator to check if it needs to stop and go interactive before every single statement evaluation of every single iteration of every single trial timepoint (rejected or otherwise), and instead only needing to perform these checks before every statement evaluation of the final iteration of accepted timepoints, significant simulation performance gains are achieved.

12. By removing the need for the simulator to check every single write access of a value-bearing object before every single statement evaluation of every single iteration of every single trial timepoint (rejected or otherwise), and instead only needing to perform these write access or value change checks before every statement evaluation of the final iteration of accepted timepoints, further significant simulation performance gains are achieved.

13. By only allowing the user to interact with the design during the final iteration replay for accepted timepoints, (i.e. effectively hiding the rejected timepoints) the ability of a competitor to reverse engineer the timestep selection algorithm is severely cramped.

14. By only allowing the user to interact with the design during the final iteration replay for accepted timepoints, (i.e. effectively hiding the rejected timepoints) the ability of a competitor to reverse engineer the timepoint rejection algorithm is severely cramped. Deciding when to reject a timepoint is an important and differentiating part of an analog simulation engine's algorithm, just as is the trial timepoint selection algorithm, and worth protecting for the very same reasons.

15. By only allowing the user to interact with the design during the final iteration replay for accepted timepoints, (i.e. effectively hiding the rejected timepoints) the ability of a competitor to reverse engineer other time-related algorithms is severely compromised. A relevant example would include the algorithm(s) used to synchronize two or more simulation engines, such as an analog and digital simulation engine in a mixed-signal simulator, or multiple analog simulation engines in a partitioned and multi-rated simulator, or any combination thereof.

By abstracting the timestep selection process and the Newton-Raphson iteration process away from the user, all of the above advantages can be gained for other time-related or iterative algorithms, such as the SpectreRF Periodic Steady State (PSS) and Envelope Following algorithms.

Although the invention is described herein with reference to the preferred embodiment, one skilled in the art will readily appreciate that other applications may be substituted for those set forth herein without departing from the spirit and scope of the present invention.

Accordingly, the invention should only be limited by the Claims included below.

The invention claimed is:

1. A method for debugging of signal behavioral models, comprising the steps of:
   (1) setting a trial time to start a transient analysis algorithm;
   (2) initializing Newton-Raphson iteration;
   (3) linearizing about the previous iteration;
   (4) choosing a model instance;
   (5) choosing a sequential statement;
   (6) executing said sequential statement;
   (7) testing whether said sequential statement is the last statement;
   (8) switching to a next statement and going to step (6) if the result of step
   (7) is false;
   (9) adding contributions to matrix A and vector b of a matrix equation Ax=b if the result of step (7) is true;
   (10) testing whether said model is the last model;
   (11) switching to a next model and going to step (5) if the result of step (10) is false;
   (12) solving said matrix equation Ax=b if the result of step (10) is true;
   (13) testing whether the solution of said matrix equation Ax=b converges;
   (14) moving to a next iteration and going to step (3) if the result of step (13) is false;
   (15) testing whether the trial timepoint is acceptable if the result of step (13) is true;
   (16) rejecting said trial timepoint, choosing an alternate timepoint, and moving to step (2) if the result of step (15) is false;
   (17) testing whether debugging is needed if the trial timepoint is accepted at step (15);
   (18) testing whether said alternate timepoint is the last time point if the result of step (17) is false;
   (19) moving to a next timepoint and moving to step (2) if the result of step (18) is false; and
   (20) finishing said algorithm if the result of step (18) is true; and wherein the last Newton-Raphson iteration of said accepted timepoint is replayed if the result of step (17) is true; and
wherein said replay of the last Newton-Raphson iteration comprises the steps of:
   (21) choosing model instance;
   (22) choosing sequential statement;
   (23) testing whether the user is debugging by single stepping through the simulation or a statement breakpoint is encountered at said sequential statement;
   (24) going interactive and then moving to step (25) if the result of step (23) is true;
   (25) executing said sequential statement if The result of step (23) is false or preceded by step (24);
   (26) testing whether a value change breakpoint or a write access breakpoint has occurred on an object of interest to the user;
   (27) going interactive and then moving to step (28) if the result of step (26) is true;
   (28) testing whether said sequential statement is the last statement if the result of step (26) is false or preceded by step (27);
   (29) moving to a next statement and moving to step (23) if the result of step (28) is false;
   (30) testing whether said model is the last model;
   (31) moving to a next model and moving to step (22) if the result of step (30) is false;
   (32) moving to step (18) if the result of step (30) is true.

2. The method of claim 1 is implemented on a simulator for solving systems of non-linear equations which can be represented by behavioral models.

3. The method of claim 1 is implemented on an analog circuit simulator.

4. The method of claim 1 is implemented on a mixed-signal simulator which comprises at least one digital simulation engine and at least one analog simulation engine.

5. The method of claim 1 is implemented on a partitioned and multi-rated analog circuit simulator.

6. The method of claim 1 is implemented on a mixed-signal simulator which comprises at least one digital simulation engine and at least one partitioned and multi-rated analog simulation engine.

7. A computer usable medium containing instructions in computer readable form for carrying out a process for debugging of signal behavioral models, wherein said process comprises the steps of:
(1) setting a trial time to start a transient analysis algorithm;
(2) initializing Newton-Raphson iteration;
(3) linearizing about the previous iteration;
(4) choosing a model instance;
(5) choosing a sequential statement;
(6) executing said sequential statement
(7) testing whether said sequential statement is the last statement;
(8) switching to a next statement and going to step (6) if the result of step (7) is false;
(9) adding contributions to matrix A and vector b of a matrix equation Ax=b it the result of step (7) is true;
(10) testing whether said model is the last model;
(11) switching to a next model and going to step (5) if the result of step (10) is false;
(12) solving said matrix equation Ax=b if the result of step (10) is true;
(13) testing whether the solution of said matrix equation Ax=b converges;
(14) moving to a next iteration and going to step (3) if the result of step (13) is false;
(15) testing whether the trial timepoint is acceptable if the result of step (13) is true;
(16) rejecting said trial timepoint, choosing an alternate timepoint, and moving to step (2) if the result of step (15) is false;
(17) testing whether debugging is needed if the trial timepoint is accepted at step (15);
(18) testing whether said altercate timepoint is the last time point if the result of step (17) is false;
(19) moving to a next timepoint and moving to step (2) if the result of step (18) is false; and
(20) finishing said algorithm if the result of step (18) is true; and
wherein the last Newton-Raphson iteration of said accepted timepoint is replayed if the result of step (17) is true; and
wherein said replay of the last Newton-Raphson iteration comprises the steps of:
(21) choosing model instance;
(22) choosing sequential statement;
(23) testing whether the user is debugging by single stepping through the simulation or a statement breakpoint is encountered at said sequential statement;
(24) going interactive and then moving to step (25) if the result of step (23) is true;
(25) executing said sequential statement if the result of step (23) is false or preceded by step (24);
(26) testing whether a value change breakpoint or a write access breakpoint has occurred on an object of interest to the user;
(27) going interactive and then moving to step (28) if the result of step (26) is true;
(28) testing whether said sequential statement is the last statement if the result of step (26) is false or preceded by step (27);
(29) moving to a next statement and moving to step (23) if the result of step (28) is false;
(30) testing whether said model is the last model;
(31) moving to a next model and moving to step (22) if the result of step (30) is false;
(32) moving to step (18) if the result of step (30) is true.

8. The computer usable medium of claim 7, wherein said process is implemented on a simulator for solving systems of non-linear equations which can be represented by behavioral models.

9. The computer usable medium of claim 7, wherein said process is implemented on an analog circuit simulator.

10. The computer usable medium of claim 7, wherein said process is implemented on a mixed-signal simulator which comprises at least one digital simulation engine and at least one analog simulation engine.

11. The computer usable medium of claim 7, wherein said process is implemented on a partitioned and multi-rated analog circuit simulator.

12. The computer usable medium of claim 7, wherein said process is implemented on a mixed-signal simulator which comprises at least one digital simulation engine and at least one partitioned and multi-rated analog simulation engine.

13. The computer usable medium of claim 7, wherein said instructions in a computer readable form may be downloaded from a website over the Internet.

14. A method for interactive debugging of mixed signal behavioral models, comprising the steps of:
advancing simulation time by iterating over a sequence of trial timepoints, from a desired initial time to a desired end time, where for each trial timepoint:
a system of non-linear ordinary differential equations representing circuit model behavior at that point in time is constructed, linearized, and solved wherein timepoint processing comprises insertion of additional steps to allow interactive debugging of accepted timepoints only before moving onto a next trial timepoint and continuing simulation algorithm execution, and wherein linearizing and solving of non-linear ordinary differential equations comprise an iterative fixed point iteration method, comprising the steps of:
iterating over a number of trial solutions, beginning with an initial guess at a trial solution, and making improved guesses at a next trial solution until convergence via construction and solution of a system of linearized non-differential equations per a fixed point iteration scheme, comprising any of a fixed point iteration, Newton Raphson iteration, or Secant Method, in which time derivative terms are numerically approximated by an integration formula, comprising any of backward Euler, forward Euler, or trapezodial first order methods, and higher order methods and wherein said system of linear equations is constructed and solved, and a determination made if a solution and timepoint are numerically acceptable and exhibit sufficient stability properties via integration error bounding, where construction and solution of a system of linearized equations comprise the step of:
iterating over each device model to be simulated, where for each device model that model's contributions to an overall system of linear equations is evaluated and contributed to said system of linearized equations and, at the end of said model iteration, said overall linear system is solved via a matrix inversion technique.

15. A method of allowing in-simulation interactive user debugging of behavioral simulation, simulation models comprising the step of:
a replaying of a final linear iteration, for accepted timepoints only, of an iterative solution process in which a system of non-linear ordinary differential equations is linearized and solved at any trial timepoint in a circuit simulator, wherein said iteration replay step further comprises the step of inserting of additional simulation steps iterating over each device model to be simulated, where for each such model its behavioral statements are iterated upon, wherein before evaluation of each such behavioral statement said simulation allows user interaction when in single stepping debug mode or when a statement breakpoint is encountered, and after execution of each model behavioral statement said simulation again allows user interaction if a value change breakpoint or write access breakpoint is triggered by a statement; said user interaction allowing said user to issue further debugging commands or queries, and set further debug breakpoints.

16. A method for interactive debugging of mixed signal behavioral models comprising the steps of:

advancing simulation time by iterating over a sequence of trial timepoints, from a desired initial time to a desired end time, where for each trial timepoint:

a system of non-linear ordinary differential equations representing circuit model behavior at that point in time is constructed and solved wherein timepoint processing further comprises insertion of additional steps which allow user interactive debugging during a final iteration replay of only accepted timepoints, before moving onto a next trial timepoint and continuing simulation algorithm execution, and wherein said non-linear ordinary differential equation solution comprises an iterative fixed point iteration, comprising the steps of:

iterating over a number of trial solutions, beginning with an initial guess at a trial solution, and making improved guesses at a next trial solution until convergence via construction and solution of a system of linear non-differential equations per a fixed point iteration scheme comprising any of fixed point iteration, Newton Raphson iteration, or Secant method, in which time derivative terms are numerically approximated by an appropriate integration formula comprising any of backward Euler, forward Euler, or trapezodial first order methods, and higher order methods and wherein said system of linear equations is constructed and solved, and a determination made if said solution and timepoint are numerically acceptable and exhibit sufficient stability properties via integration error bounding, and where construction and solution of a system of linear equations comprise the step of:

iterating over each device model to be simulated, where for each device model that model's contributions to an overall system of linear equations is evaluated and contributed to said system of linear equations and, at the end of said model iteration, said overall linear system is solved via a matrix inversion technique; and further comprising the step of iteration replay, comprising the steps of again iterating over each device model to be simulated, where for each such model its behavioral statements are iterated upon, wherein before evaluation of each such behavioral statement said simulation allows user interaction when in single stepping debug mode or when a statement breakpoint is encountered, and after execution of each model behavioral statement said simulation again allows user interaction if a value change breakpoint or write access breakpoint is triggered by a statement; said user interaction allowing said user to issue further debugging commands or queries set further debug breakpoints.

17. A method for debugging of mixed signal behavioral models, using an extended Newton-Raphson-based mixed signal simulator algorithm, is comprising the steps of: advancing simulation time by iterating over a sequence of trial timepoints, from a desired initial time to a desired end time, where for each trial timepoint:

system of non-linear ordinary differential equations representing circuit model behavior at that point in time is constructed and solved by of testing at acceptable timepoints only if interactive debugging is requested and, if so, allowing interactive debugging during these acceptable timepoints via iteration replay before moving onto a next trial timepoint, and continuing simulation algorithm execution, and wherein non-linear ordinary differential equation solution comprises an iterative method comprising the steps of:

iterating over a number of trial solutions, beginning with an initial guess at a trial solution, and making improved guesses at a next trial solution until convergence via construction and solution of a system of linear non-differential equations per a Newton Raphson iteration scheme, in which time derivative terms are numerically approximated by an appropriate integration formula, comprising any of backward Euler, forward Euler, or trapezodial first order methods, and higher order methods, and wherein said system of linear equations is constructed and solved, and a determination made if a solution and timepoint are numerically acceptable and exhibit sufficient stability properties via integration error bounding, wherein construction and solution of a system of linear equations comprises the steps of:

iterating over each device model to be simulated, where for each device model that model's contributions to an overall system of linear equations is evaluated and contributed to said system of linear equations, and at the end of said model iteration an overall linear system is solved via a matrix inversion technique;

further comprising the step of replaying a last linear equation iteration of a last accepted timestep if interactive debugging is requested, said iteration replay comprising the steps of again iterating over each device model to be simulated, where for each such model its behavioral statements are iterated over, wherein before evaluation of each behavioral statement said simulation allows user interaction when in single stepping debug mode or when a statement breakpoint is encountered, and after execution of each model behavioral statement said simulation again allows user interaction if a value change breakpoint or write access breakpoint is triggered by statement; the said user interaction allowing said user to issue further debugging commands or queries, and set further debug breakpoints.

18. The method of any of any of claims 14–17, wherein the user may interactively debug a behavioral model by single stepping through the simulation.

19. The method of any of claims 14–17, wherein the user may interactively debug a behavioral model when one of a statement breakpoint, an object value change breakpoint, or a write access breakpoint is triggered in the simulation.

20. The method of any of claims 14–17 comprising instructions in computer readable form on a computer usable medium.

21. The method of claim 20 wherein the instructions in computer readable form may be downloaded from websites over the Internet.

22. The method of any of claims 14–20 implemented on a simulator for solving systems of non-linear equations which can be represented by behavioral models.

23. The method of any of claims 14–20 implemented on an analog circuit simulator.

24. The method of any of claims 14–20 implemented on a mixed-signal simulator which comprises at least one digital simulation engine and at least one analog simulation engine.

25. The method of any of claims 14–20 implemented on a partitioned and multi-rated analog circuit simulator.

26. The method of any of claims 14–20 implemented on a mixed-signal simulator which comprises at least one digital simulation engine and at least one partitioned and multi-rated analog simulation engine.

\* \* \* \* \*